United States Patent [19]
Klappert et al.

[11] Patent Number: 5,903,102
[45] Date of Patent: May 11, 1999

[54] ELECTRO-OPTICAL DISPLAY DEVICE AND FLEXIBLE SUPPORT FOR SUCH DEVICES USED FOR THE SUPPLY OF SUCH DEVICES

[75] Inventors: Rolf Klappert, Neuchâtel; Pierre Desarzens, Bienne, both of Switzerland

[73] Assignee: Omega Electronics S.A., Bienne, Switzerland

[21] Appl. No.: 08/916,238

[22] Filed: Aug. 22, 1997

[30] Foreign Application Priority Data

Sep. 4, 1996 [FR] France ................................ 96 10764

[51] Int. Cl.⁶ .................................................. H01L 23/48
[52] U.S. Cl. .......................... 313/512; 313/511; 313/495; 313/456; 313/238; 313/292; 313/284
[58] Field of Search ............................ 313/512, 510, 313/498, 511, 495, 456, 238, 292, 284, 268, 325

[56] References Cited

U.S. PATENT DOCUMENTS

| | | |
|---|---|---|
| 3,517,245 | 6/1970 | Dickson, Jr. et al. ............... 313/512 X |
| 4,241,277 | 12/1980 | Hintze et al. ........................ 313/511 X |
| 4,727,285 | 2/1988 | Taniguchi ................................. 313/512 |
| 4,763,223 | 8/1988 | Tang ..................................... 313/512 X |
| 5,089,314 | 2/1992 | Masujima et al. ....................... 428/156 |
| 5,299,681 | 4/1994 | Kadono et al. ....................... 198/690.1 |
| 5,565,733 | 10/1996 | Krafcik et al. ....................... 313/511 X |

*Primary Examiner*—Ashok Patel
*Attorney, Agent, or Firm*—Griffin, Butler, Whisenhunt & Szipl, LLP

[57] ABSTRACT

The electro-optical display device includes at least one electro-optical assembly, in particular an electro-optical cell (4), electrically connected to a supply unit (12) by means of elongated flexible supports (6, 8). Metallized tracks are arranged on the flexible supports which support integrated circuits (16). The flexible supports are assembled to the electro-optical cell and have loose intermediate portions formed by folds (42) which are free and thus allow positioning of each segment (44) situated between two consecutive folds with respect to the electro-optical cell which is independent of the positioning of the other segments.

8 Claims, 4 Drawing Sheets

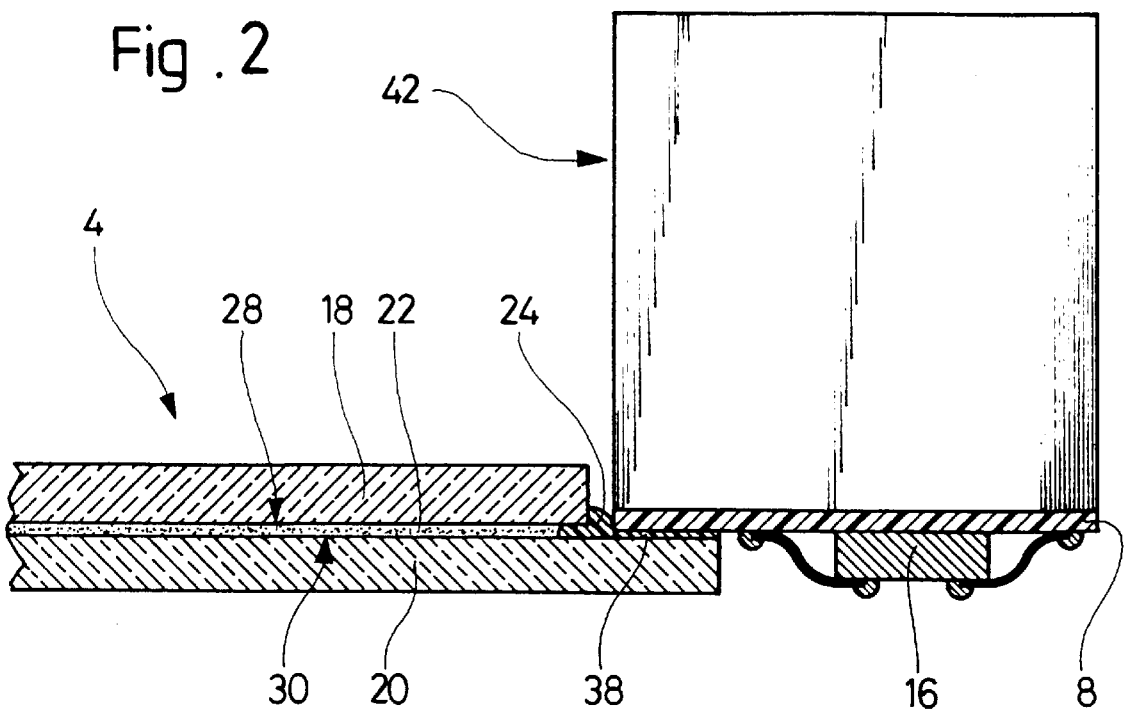
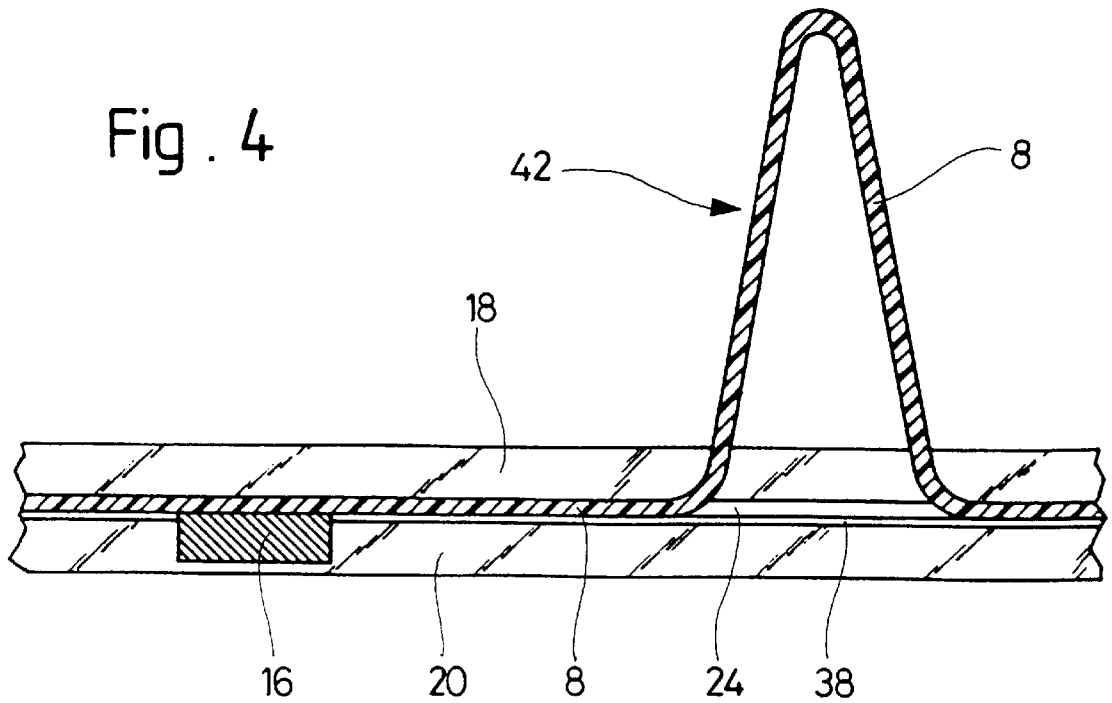

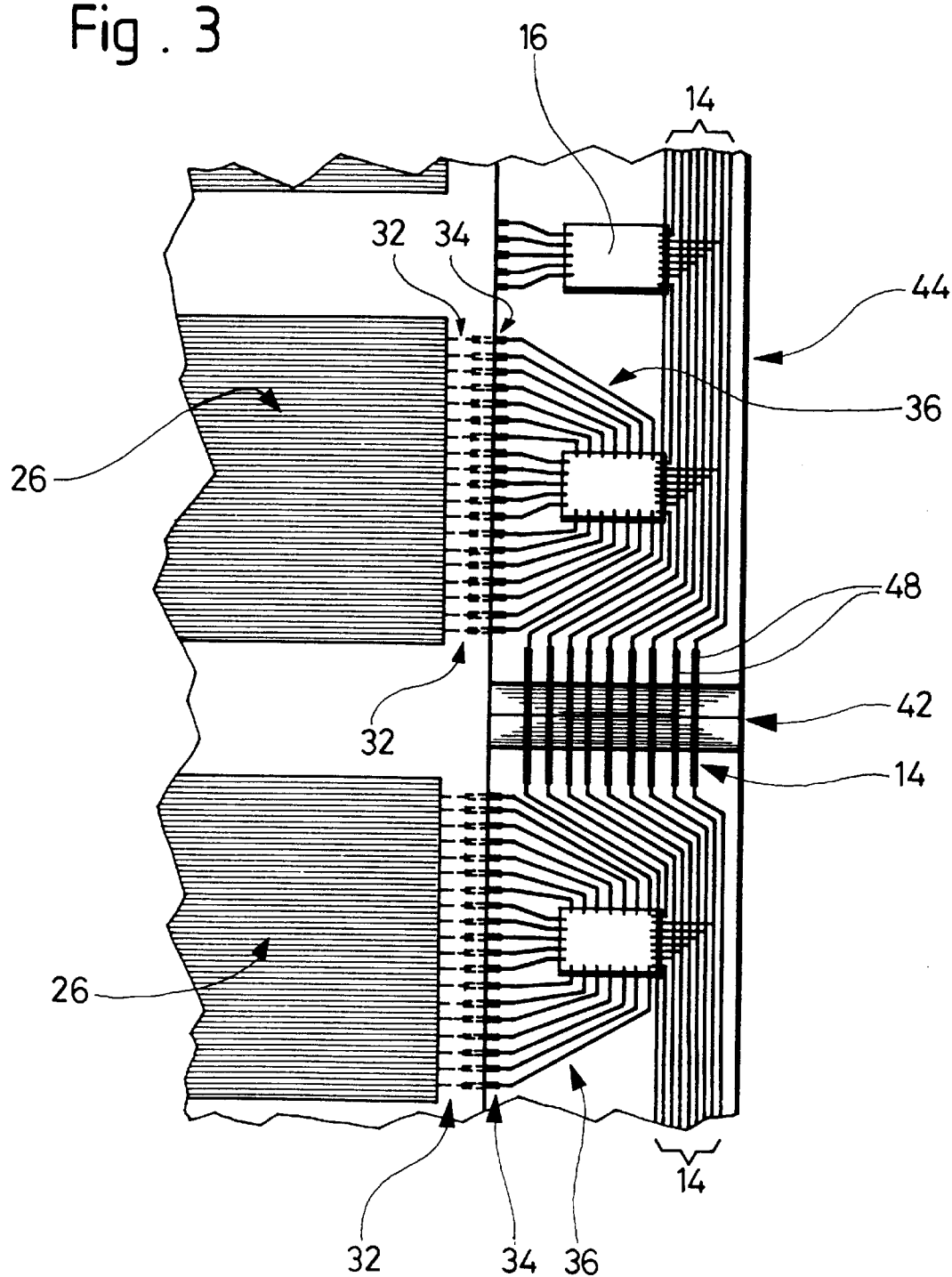

1

ELECTRO-OPTICAL DISPLAY DEVICE AND FLEXIBLE SUPPORT FOR SUCH DEVICES USED FOR THE SUPPLY OF SUCH DEVICES

The present invention concerns electro-optical display devices, in particular liquid crystal display devices, including at least one display module comprising at least one electro-optical assembly and means for supplying such assembly.

In particular, the invention concerns the means for supplying one or more active units of one or more electro-optical assemblies. The present invention also concerns more specifically supply means for electro-optical display devices assuring electrical connections between a supply source or unit and one or more electro-optical assemblies. The present invention concerns more particularly electro-optical display devices of large dimensions, namely having dimensions of the order of several centimetres, but it is not limited to electro-optical display devices having such dimensions.

Electro-optical display devices including a display module comprising an electro-optical cell formed of first and second transparent substrates between which is provided a layer of liquid crystal are known. Electrodes and counter electrodes are provided on the internal faces of said first and second transparent substrates. These electrodes and counter electrodes arranged on the first and second transparent substrates are connected by electric supply tracks to a supply source or unit of the electro-optical display module. These electric supply tracks are directly arranged on one or other of the two transparent substrates and consist of a transparent material known to the man skilled in the art. However, these transparent electric supply tracks directly deposited on the substrate require relatively large widths to allow the passage of an electric signal of sufficient intensity to control several supply control units of the various active units.

Conversely, the tracks connecting the supply control units to one or more active units may be relatively narrow given that they need only carry low supply currents, whereas the tracks connecting the aforementioned various control units to a supply source must be much wider to be able to carry electric currents of sufficient intensity with known materials for manufacturing transparent tracks.

Thus, the dimensions of the electro-optical module must be sufficient to allow the arrangement of electric supply tracks connecting the aforementioned control units to a supply source. Moreover, the arrangement of these control units on the surface of one of the substrates of the electro-optical assembly is a delicate and costly operation in terms of time and materials, requiring in addition handling of the substrate which supports the control units, which is awkward when the manufactured electro-optical module comprises at least one electro-optical assembly of large dimensions.

An object of the present invention is thus to provide an electro-optical display device able to be manufactured easily at a lower manufacturing cost than that of the electro-optical display devices of the prior art described hereinbefore.

Another object of the invention is to reduce the dimensions of the electro-optical display unit for an electro-optical display cell of given dimensions.

Another object of the invention is to reduce the dimensions of the substrate on which are deposited the electrodes of one or more active units of an electro-optical assembly of given dimensions.

Another object of the invention is to provide electric connection means between the electro-optical assembly and a supply source which are inexpensive, easy to manufacture and which allow continuous automated manufacturing of electro-optical display devices.

Further objects of the present invention will also appear upon reading the following description.

The present invention concerns an electro-optical display device comprising at least one display module including at least one electro-optical assembly which includes at least one active unit and means for supplying such assembly. This display device is characterised in that the supply means comprise an elongated flexible support on which metallized electric connection tracks are arranged to connect said at least one active unit to a supply unit of the supply means. The elongated flexible support is assembled to the electro-optical assembly and has at least one loose intermediate portion situated between two electric connection pad assemblies connected to the supply tracks of said electro-optical assembly.

As a result of the features of the subject of the invention described hereinbefore, it is possible to manufacture display modules at an advantageous price while assuring excellent electric supply of the active unit(s). The presence of one or more loose intermediate portions situated between two or more electric connection pad assemblies connected to corresponding electric connection pads of the electro-optical assembly itself allows accurate alignment of each of these connection pad assemblies of the flexible support with said corresponding connection pad assemblies to be guaranteed. It will be noted that the electric connection pads may simply consist of the end of the electric conductor tracks.

In particular for electro-optical display devices of large dimensions, the difference in nature of the materials present, the manufacturing tolerances of the electric conductor tracks and the assembly tolerances of the electro-optical assembly with the flexible support do not allow correct alignment over a relatively large distance of all the electric connection pads between the flexible support and the electro-optical assembly when the flexible support is connected in a fixed manner to the electro-optical assembly over its entire length as would be the case in the absence of the loose intermediate portions provided within the framework of the present invention. These loose intermediate portions are all the more necessary for assuring positioning accuracy of the electric connection pad assemblies given that the flexible support and the electro-optical assembly for which it is intended are generally assembled either by heat bonding or by welding. Thermomechanical stresses with a tendency to deform in part the elongated flexible support result from this operation. As a result of the loose intermediate portions provided, it is possible to position the elongated flexible support by section, i.e. to position independently each portion situated on either side of a loose intermediate portion.

According to a first embodiment, the loose intermediate portion consists of a fold of the elongated flexible support.

By way of example, the elongated flexible support consists of a polyester or polymide material.

The invention also concerns a flexible support for an electro-optical display device used to connect electrically at least one active unit of at least one electro-optical assembly to a supply unit of such display device. This flexible support has on at least one of its surfaces metallized tracks extending along the longitudinal direction of such flexible support and intended to be electrically connected to a supply unit. This flexible support has intermediate portions, between portions intended to assure electric connections with said active units, where said metallized tracks have a spacing greater than the spacing of such metallized tracks in said portions intended to assure electric connections with said at least one active unit.

The flexible support, which is the subject of the present invention, may be used in the manufacturing of display devices according to the invention. The fact that, in the intermediate portions, the metallized tracks have a spacing greater than the spacing of such metallized tracks in the portions intended to assure electric connections with the electro-optical assembly allows, after cutting the flexible support in one of these intermediate portions, a connector to be arranged allowing electro-optical modules to be connected to each other and also allowing each electro-optical module to be connected to a supply unit of the display device.

According to a particular feature of the invention, the metallized tracks in the intermediate portions have a greater width than that of such metallized tracks in the portions intended to assure electric connections with the active units. Consequently, the reliability of the electric supply is increased given that these intermediate portions are intended to form the loose intermediate portions, in particular in the form of folds, once the flexible support is assembled to an electro-optical assembly to from a display device according to the invention. These loose intermediate portions have a ripple in the embodiment proposed hereinafter and may be subjected to greater mechanical stress than the other portions of the flexible support. Moreover, after transverse cutting of the flexible support, it is easy to arrange a connector to one or other of the two resulting ends, the electric connection pads being already arranged on the flexible support.

As a result of the particular arrangement of the flexible support, it is possible to provide this flexible support in the form of a continuous strip intended to be cut during manufacturing of electro-optical display devices so as to obtain sections of any predetermined length intended for so many electro-optical modules forming such display devices.

The present invention will be described more particularly with reference to the following description, made with reference to the attached drawings given by way of non limiting example, in which:

FIG. 2 is a cross-section along cross-section line II—II of FIG. 1;

FIG. 3 is a schematic plane view corresponding to a partial bottom view of FIG. 1;

FIG. 4 is a cross-section along cross-section line IV—IV of FIG. 1; and

An embodiment of an electro-optical display device according to the invention will be described hereinafter with reference to FIGS. 1 to 4.

Figure 1:
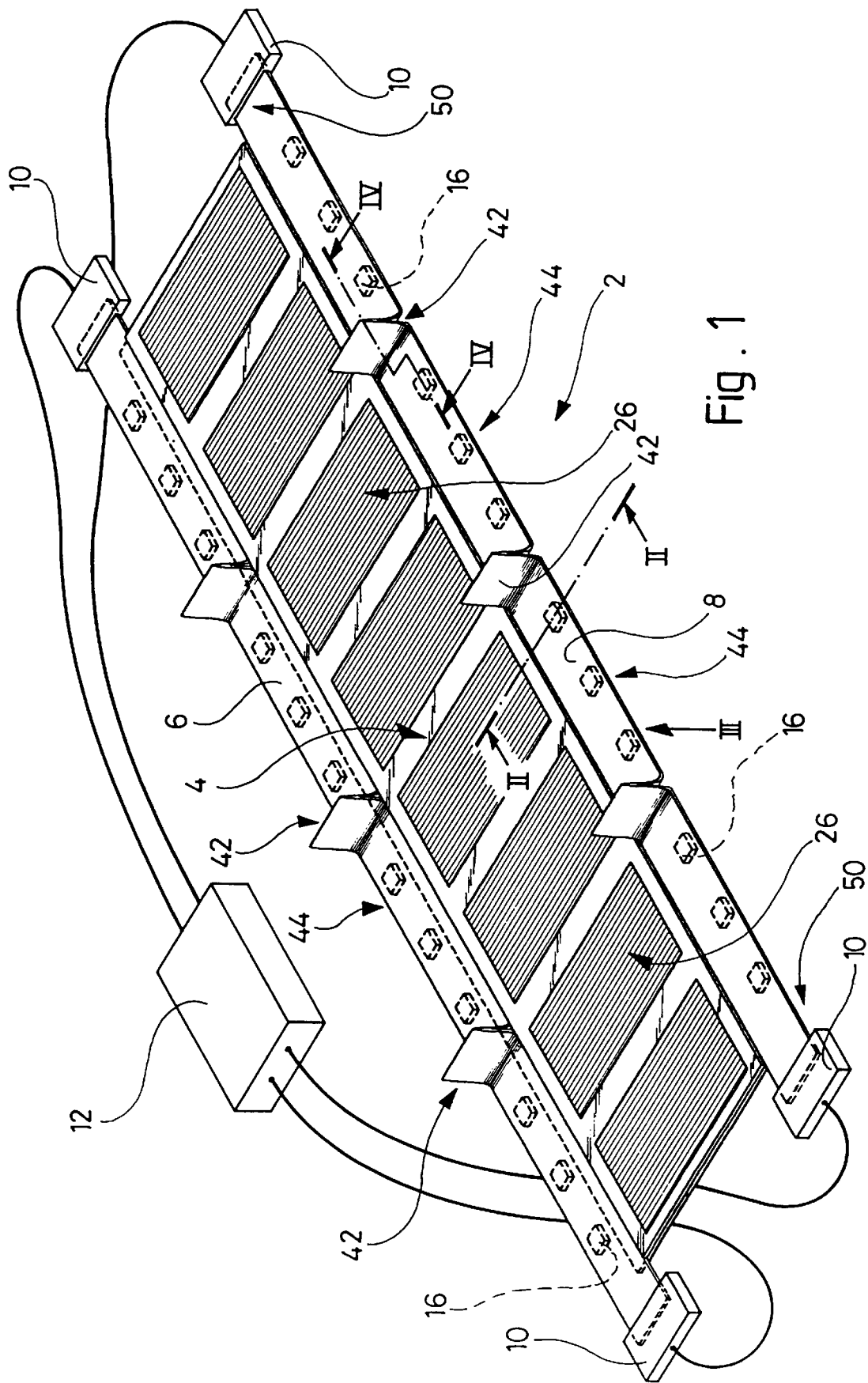
FIG. 1 shows a schematic perspective view of an electro-optical module intended for an electro-optical display device according to the invention.

FIG. 1 shows schematically an electro-optical display module 2. It will be mentioned that the drawing is schematic and that the display module may include other additional elements, in particular a case or housing. Module 2 comprises an electro-optical cell 4 and means for supplying electro-optical cell 4 comprising two elongated flexible supports 6 and 8, connectors 10 and a supply unit 12 electrically connected to connectors 10. These connectors 10 are used to connect electrically metallized tracks 14 (FIG. 3) arranged on at least one surface of each of the two flexible supports 6 and 8.

Integrated circuits 16 are arranged on flexible supports 6 and 8. These integrated circuits 16 are electrically connected to metallized tracks 14. Electro-optical cell 4 consists of two glass plates 18 and 20 between which is extends a liquid crystal 22. The cavity formed between glass plates 18 and 20 for liquid crystal 22 is sealed by means of an adhesive material 24 in a conventional manner. It will be noted that the plates may be also be made of plastic.

Electro-optical cell 4 comprises a plurality of active units 26. Each of these active units 26 is electrically connected to one or more integrated circuits 16 by means of a set of tracks 32 arranged on one or other of the surfaces 28 and 30 of respective glass plates 18 and 20. This set of tracks 32, generally made of a transparent material known to the man skilled in the art, is connected to a set of respective electric connection pads 34 arranged on each of flexible supports 6 and 8. These sets of electric connection pads 34 are formed by metallization on flexible support 6, 8 respectively, and are each connected to one or other of integrated circuits 16 via metallized tracks 36 arranged on support 6, 8 respectively. The electric connection between tracks 32 deposited on the glass and connection pads 34 arranged on flexible support 6 or 8 may be achieved via bonding or welding.

In the present case, flexible supports 6 and 8 are mechanically and electrically connected to electro-optical cell 4 by means of an anisotropic conductive adhesive material 38 known to the man skilled in the art. When the end of tracks 32 are superposed onto electric connection pads 34, an electric contact is established between such tracks 32 and such connection pads 34 by means of anisotropic adhesive material 38. Thus, it is necessary to have an accurate alignment between the ends of tracks 32 of electro-optical cell 4 and electric connection pads 34 of flexible support 6, 8 respectively.

Active units 26 generally consist of a plurality of electrodes the majority of which are individually addressed. The connection between the plurality of electrodes (and also counter-electrodes) and integrated circuits 16 for performing such addressing allows various given data to be displayed. The electric connection between the plurality of electrodes and counter-electrodes of each of active units 26 to integrated circuits 16 is achieved via supply tracks 32 of cell 4 and metallized tracks 36 on flexible support 6, 8 respectively, which end in a set of electric connection pads 34 which must be aligned with the ends of respective supply tracks 32 to assure the electric connections between this active unit 26 and integrated circuit(s) 16.

Given the plurality of electrodes and counter-electrodes of each active unit 26, the density of the ends of supply tracks 32 and the corresponding density of electric connection pads 34 are generally high. During assembly of flexible supports 6 and 8 to glass plate 20 of electro-optical cell 4, it is difficult to assure proper alignment of the ends of supply tracks 32 with electric connection pad sets 34 over a relatively large distance. There are several reasons for this. First, there is the question of the manufacturing tolerance of supply tracks 32 and connection pads 34. Secondly, flexible supports 6 and 8 are generally formed of a material able to be slightly deformed, in a resilient or plastic manner. Thirdly, during hot assembly of flexible supports 6 and 8 to electro-optical cell 4, thermomechanical stresses are generated, able in particular to cause a certain expansion or deformation of flexible supports 6 and 8.

In order to overcome this problem in particular, at least one loose intermediate portion, formed in the present embodiment by a fold 42, is provided according to the invention. FIG. 1 shows three loose intermediate portions, namely three folds 42 for each of flexible supports 6 and 8.

Each fold 43 is situated between two sets of electric connection pads 34. Moreover, in the present case, each fold is situated between two sets of electric connection pads 34 respectively associated with two adjacent active units 26. In FIG. 1, three integrated circuits 16 correspond to each active unit 26. Thus, for addressing the two adjacent active units 26, three integrated units 16 on flexible support 6 and three integrated circuits 16 on flexible support 8 are necessary. Folds 42 are distributed with predetermined periodicity whose value corresponds substantially to the width occupied by two adjacent active units 26.

It will be noted that the folds are free, i.e. they are not directly fixed to glass plate 20 by means of anisotropic conductive adhesive material 38 provided in the present embodiment. In an alternative embodiment, the metallized tracks in the loose intermediate regions are covered with a protective layer to avoid any short-circuits in the folds. As a result of the arrangement of folds 42 along each flexible support 6 and 8, it is possible to align the ends of supply tracks 32 with sets of electric connection pads 34 by segment or portion during manufacturing of the electro-optical module included in the display device according to the invention. Adhesive 38 material may be deposited initially either on plate 20 or on flexible support 6 or 8. Moreover such adhesive material may be deposited over the entire length of the flexible support or only along segments 44 situated between loose intermediate portions 42.

In the present embodiment, the tolerances during assembly must allow alignment of electric tracks 36 connected to three integrated circuits 16 which succeed each other or which are associated with two adjacent active units 26. It is understood that the maximum difference between the spacing of the two end tracks of supply tracks 32 associated to the two end connection pads of a set of connection pads 34 in a segment 44 defined by two folds 42 is the same in the manufacturing of an electro-optical module according to the invention as the maximum tolerated difference between the two end supply tracks 32 of a cell 4 and the two corresponding connection pads situated at both ends of the flexible support in an embodiment which would not include loose intermediate portions.

According to an additional feature of the invention, portions 48 of metallized tracks 14 which are situated in the respective regions of loose intermediate portions 42 have a greater spacing than that of these same metallized tracks 14 in the regions situated between loose intermediate portions 42, i.e. in segments 44.

Moreover, the width of portions 48 of metallized tracks 14 have a greater width in the regions of loose intermediate portions 42 than in the regions of segments 44. As a result of this arrangement, it is possible to assemble a connector 10 to flexible support 6 or 8 in the loose portions of end 50. In order to do so, flexible support 6, 8 respectively, is cut in such a way that portions 48 of tracks 14 are situated in both end regions of each flexible support 6 and 8.

Figure 5:
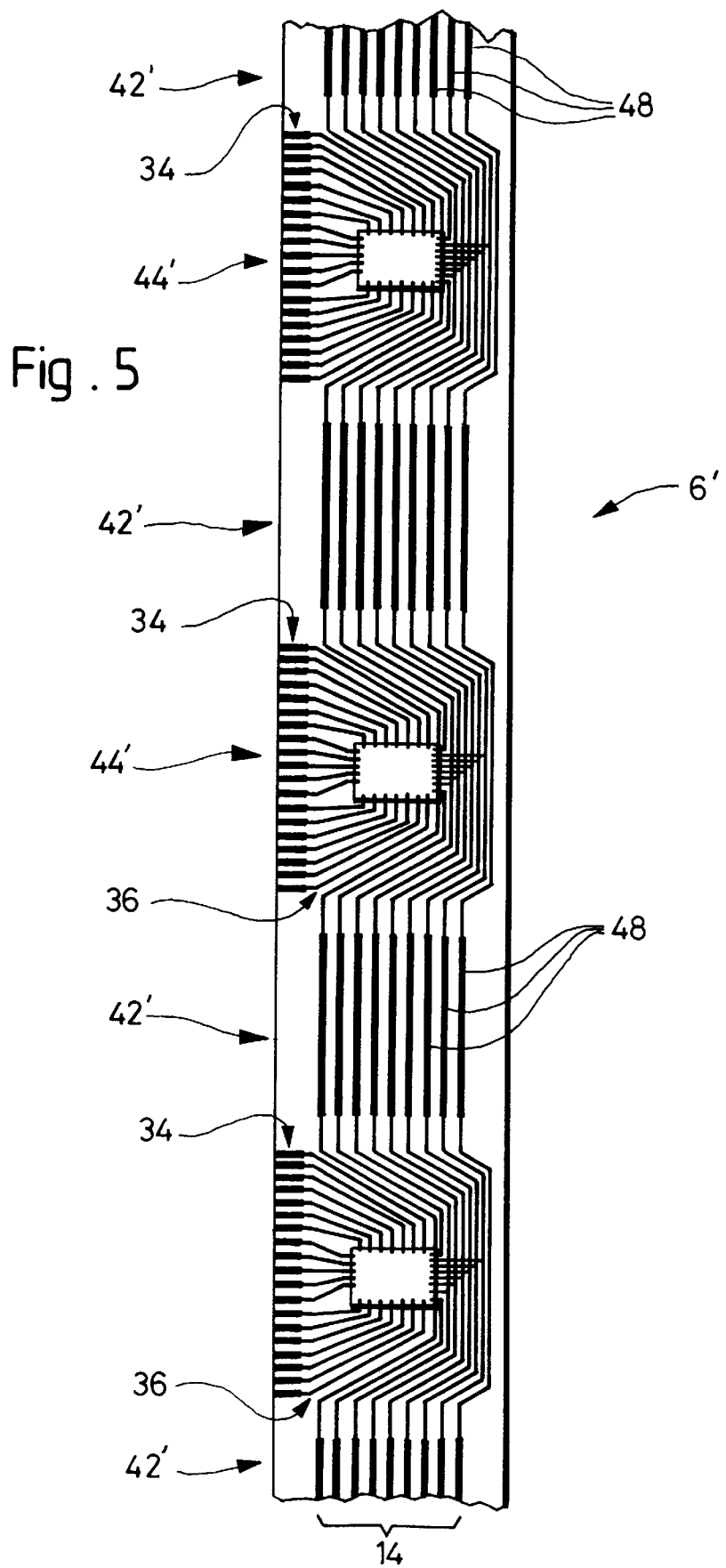
FIG. 5 is a schematic top view of an elongated flexible support.

FIG. 5 shows a flexible support 6' which corresponds to flexible support 6, after the arrangement of integrated circuits 16 but before the assembly thereof to electro-optical cell 4. Flexible support 6' is also the subject of the present invention. This flexible support 6' has metallized tracks 14 used to connect integrated circuits 16 to a supply unit of an electro-optical display device. This support 6' also comprises tracks 36 for electrically connecting integrated circuits 16 to active units of electro-optical cells The arrangement of the metallized tracks and integrated circuits 16 defines intermediate portions 42' between portions 44' where sets of electric connection pads 34 and also integrated circuits 16 are arranged. In intermediate portions 42', portions 48 of metallized tracks 14 situated in such intermediate portions have a greater spacing than that of such metallized tracks in portions 44'. Portions 48 of metallized tracks 14 have a greater spacing than the width of such metallized tracks 14 in the regions of portions 44'.

As has already been mentioned hereinbefore, the arrangement of intermediate portions 42' allows, after transverse cutting of flexible support 6', a conventional connector to be arranged at both resulting ends of cut flexible support 6'. This connector allows an electric connection to be established between each metallized track 14 and an electric supply of a display device according to the invention.

Thus, each intermediate region 42' may be used for the arrangement of a connector or for the formation of a loose intermediate portion, such as a fold, as has been described hereinbefore. Consequently, it is possible to manufacture flexible support 6' in the form of a continuous strip and to manufacture several electro-optical display modules with the aid of a single flexible support 6' initially having the shape of a strip.

Moreover, as a result of the features of the invention, it is possible to manufacture from the same strip-shaped flexible support 6' various electro-optical display modules having different dimensions, in particular a different number of active units. Thus, with the aid of the same flexible support 6', it is possible to manufacture in the embodiment of FIG. 1 electro-optical modules having any even number of active units 26.

It will be noted that there may be any number of integrated circuits and any number of electric connection pads 34 by segment 44, 44' respectively.

Finally it will be noted that, in an alternative of the embodiment described with reference to FIGS. 1 to 4, a single flexible support 6 may be provided instead of two flexible supports 6 and 8 shown in FIG. 1.

What is claimed is:

1. An electro-optical display device comprising at least one display module including at least one electro-optical assembly which includes at least one active unit and means for supplying said electro-optical assembly, characterised in that the supply means comprise an elongated flexible support on which metallized electric connection tracks are arranged to connect said at least one active unit to a supply unit of the supply means, said elongated flexible support being assembled to the electro-optical assembly and having at least one loose intermediate portion situated between two sets of electric connection pads electrically connected to supply tracks of said electro-optical assembly.

2. A display device according to claim 1, wherein said loose intermediate portion consists of a fold of said flexible support.

3. A display device according to claim 2, wherein said display module comprises a glass plate on the edge of which is fixed said flexible support, said fold being free.

4. A display device according to claim 1, wherein said elongated flexible support has several loose intermediate portions distributed with predetermined periodicity and separating sets of electric connection pads between said flexible support and said electro-optical assembly.

5. A display device according to claim 1, wherein integrated circuits are arranged on said flexible support, said integrated circuits being electrically connected to said metallized tracks.

6. A display device according to claim 1, wherein said flexible support consists of a polyester or polymide material.

7. A display device according to claim 4, wherein the portions of said metallized tracks situated in the respective regions of said several loose intermediate portions have a greater spacing than that of said metallized tracks between said several loose intermediate portions.

8. A display device according to claim 7, wherein said portions of said metallized tracks, situated in the respective regions of said several loose intermediate portions, have a greater width than that of said metallized tracks between the several loose intermediate portions.